US 6,731,180 B1

(12) United States Patent
Clark et al.

(10) Patent No.: US 6,731,180 B1
(45) Date of Patent: *May 4, 2004

(54) EVACUATED HYBRID OVENIZED OSCILLATOR

(75) Inventors: Roger L. Clark, Windham, NH (US); Joseph V. Adler, New Milford, CT (US); Jacob M. Li, Danbury, CT (US)

(73) Assignee: Deleware Capital Formation Inc., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/056,958

(22) Filed: Oct. 22, 2001

Related U.S. Application Data

(60) Provisional application No. 60/242,103, filed on Oct. 20, 2000.

(51) Int. Cl.[7] ............... H03B 5/32; H03L 7/00
(52) U.S. Cl. ............ 331/176; 331/68; 331/69; 331/158; 310/341; 310/343; 310/344
(58) Field of Search ................. 310/343, 346, 310/340, 341, 342, 344; 331/68, 69, 158, 176

(56) References Cited

U.S. PATENT DOCUMENTS

| | | |
|---|---|---|
| 4,213,104 A | 7/1980 | Cullen et al. |
| 4,317,985 A | 3/1982 | Wilson |
| 4,427,515 A | 1/1984 | Yuhara et al. |
| 5,059,848 A | 10/1991 | Mariani |
| 5,594,979 A | 1/1997 | Borchelt et al. |
| 5,771,556 A | 6/1998 | Allen et al. |
| 5,917,272 A | 6/1999 | Clark et al. |
| 5,919,383 A | 7/1999 | Beguin et al. |
| 6,114,635 A | 9/2000 | Lakin et al. |
| 6,131,256 A | 10/2000 | Dydyk et al. |
| 6,147,565 A * | 11/2000 | Satoh et al. ............ 331/70 |
| 6,187,611 B1 | 2/2001 | Preston et al. |
| 6,236,145 B1 * | 5/2001 | Biernacki ............ 310/346 |

OTHER PUBLICATIONS

Jackson, Harold W., Tactical Miniature Crystal Oscillator, Proc. 34th Annual Frequency Control Symposium, USAERADCOM, May 1980, pp. 449–456, Ft. Monmouth, NJ USA.

Clark, Roger L., Design Considerations of Vacuum–Sealed OCXO's for high Realiability Applications, IEEE International Frequency Control Symposium, pp. 481–483, Jun. 1996.

Clark, Roger L, Adler, Li J., Improved Aging Results Using Thick–Film Hybrid Packaging and Evacuated Miniature Ovenized Oscillators Using Such Packaging, Joint Meeting EFTF—IEEE IFCS, pp. 420–424, Apr. 1999.

* cited by examiner

Primary Examiner—Arnold M. Kinkead
(74) Attorney, Agent, or Firm—Maine & Asmus

(57) ABSTRACT

The present invention is for a thermally controlled package for oscillators, particularly evacuated miniature surface acoustical wave oscillators (EMSO) devices. In a preferred embodiment the surface acoustical wave device is bonded directly to a heated substrate. The package is evacuated to improve temperature characteristics. A temperature heater, sensor, and control controller are utilized to maintain the internal package temperature above ambient. In one embodiment there is an additional substrate layer that house components that are not sensitive to temperature with interconnects electrically connecting the heated substrate and the additional substrates.

21 Claims, 7 Drawing Sheets

EVACUATED HYBRID OVENIZED OSCILLATOR

CROSS REFERENCE TO RELATED APPLICATIONS

This application claims priority under 35 U.S.C. Section 119 from a U.S. patent application Ser. No. 60/242,103 filed on Oct. 20, 2000, which is incorporated herein by reference for all purposes.

BACKGROUND OF THE INVENTION

1. Technical Field of the Invention

The present invention relates to the field of temperature controlled structures, and more particularly, to a temperature controlled structure for resonator devices. The present structure includes direct bonding of a surface acoustic wave (SAW) device and incorporating multiple layers.

2. Background of the Invention

Oven controlled crystal oscillators (OCXO) are well known in the industry. These devices typically contain crystal resonators that resonate at a certain frequency. The resonant frequency varies with temperature, therefore stable frequencies require stable temperature environments.

The OCXO devices are packaged into some form of shell or casing that allows the device to be transported, handled, and incorporated into other electronic goods. There may be heaters associated inside the package along with temperature sensors and temperature controllers to maintain a stable thermal management of the device.

Integrated oscillator assemblies in particular are highly sensitive to temperature changes and operate non-linearly with temperature fluctuations. The oscillators arc generally used for providing highly precise reference frequencies or frequency sources. A typical precision oscillator, which includes a quartz crystal, normally has temperature sensors and some control means to stabilize temperature instability.

Despite the efforts of thermal management, in many cases the precision components are so sensitive to temperature that accurately measuring the temperature and controlling the circuit is not possible. The inability to maintain a precise temperature results in thermal drift from the desired temperature. Typically the temperature varies about the desired goal temperature and the amount of deviation produces frequency instability.

In addition, there may be thermal variations at different locations of the same circuit. The thermal distribution across the circuit board may result in differing temperatures and therefore differing performance even on the same circuit. Attempting to compensate for these thermal inconsistencies or gradients is difficult to implement.

Some of the prior art methods for dealing with temperature variations involve bonding a circuit board to a thermally conductive plate or temperature controlled plate. Other packages involve temperature controlled structures using heaters, while even further concepts use an oven structure placed inside another oven, appropriately called a double oven.

Temperature stability is improved by placing the oscillator device in an oven and maintaining the temperature of the device at a higher level than outside ambient. Such OCXO devices are well-known in the art and are commonly used in applications such as radio base stations that encounter large temperature variations. The oven keeps the temperature range of the oscillator within a very small window. In some stringent applications an additional oven houses the temperature controlled oven, producing what is termed a double oven system.

Despite all the efforts and variations of the prior art, temperature control is not generally uniform. The thermal control may be sufficient in one section of the board and inadequate in another section. There is a general lack of uniform thermal flow across the entire circuit.

Thermal gain is a figure of merit for quantifying the temperature stabilization of a structure. It is defined as the ratio of change in external or ambient temperature $\Delta Ta$, to the change in temperature of a small volume $\Delta Tv$ reference.

$$\text{Thermal Gain} = \Delta Ta / \Delta Tv$$

When the thermal gain is small, there is more temperature change with a change in ambient temperature. A higher thermal gain equates to a more stable environment because there is little temperature change with a corresponding change in ambient temperature. On a given circuit is possible to have both high and low thermal gain, and possibly even a negative thermal gain.

Besides OCXO devices exhibiting thermal management problems, the problem is even more prevalent for surface acoustic wave (SAW) devices. SAW devices suffer from the same problems as the OCXO counterparts, but SAW devices operate at much higher frequencies. More specifically, SAW devices operate as much as ten times higher frequencies than the standard crystal resonators. SAW devices also have a higher percentage of error than BAW devices. Thus, very small percentages of error result in a greater frequency difference, and this has been one of the primary drawbacks of SAW devices in these applications.

A SAW device depends upon acoustic wave generation to function properly. In most cases the acoustic waves are in close proximity to the surface of the substrate, which makes the devices very sensitive to external conditions such as temperature, stresses and vibrations.

Thermal conductivity is a major factor in the design of ovenized oscillators, whether OCXO or SAW. It has been demonstrated that the performance of ovenized oscillators can be significantly enhanced by evacuating the entire package prior to sealing, which results in a lower thermal loss. Evacuated miniature SAW (EMSO) devices have been utilized with some success.

While temperature considerations are important, it is also necessary to consider vibration conditions. The mounting of the SAW device is important in order to avoid interfering vibrations. Generally the SAW devices are mounted onto carriers, or otherwise disposed in a manner that supports the SAW device and reduces vibration troubles. EMSO devices have a smaller overall mass, which further reduce vibration problems.

There have been many attempts to alleviate the aforementioned problems. In U.S. Pat. No. 4,213,104, a SAW device is vacuum encapsulated for improvements of the thermal characteristics. Packaging methods are disclosed in U.S. Pat. Nos. 5,594,979 and 5,059,848. These patents lay out the foundation of the problems related to the thermal management of SAW devices and various attempts to resolve these problems.

The issued U.S. Pat. No. 5,917,272 ('272) to the same applicant, incorporated herein in its entirety by reference, describes an ovenized oscillator mounted over a heat conducting substrate, wherein the substrate is thermally isolated from the base by insulated posts. The resonator is suspended above the heated substrate and held in place by clips that permit radiative thermal flow. The '272 device did not disclose en enabling description of using SAW devices.

U.S. Pat. No. 4,317,985 ('985) describes an OCXO device with dual heater apparatus to achieve very high thermal gains at the location of the sensor, or by using two heaters, at a selected location. This location normally coincides with the most sensitive component—generally the crystal. It also describes adjusting the ratio of power between the heaters. A major drawback to this approach is the temperature gradients in other locations of the circuit is excessively poor.

In U.S. Pat. No. 5,919,383 a package for a temperature sensitive optical device is described. The package contains an inner and outer container of low thermal polymer and with an insulating material disposed therebetween. The temperature sensitive circuit is contained within the inner container along with a temperature sensor. The control circuit is outside the inner container and controls the heating element(s) that are located inside the inner compartment and in contact with the temperature sensitive circuit. Within the inner container is a thermally conductive plate that attaches to the circuit, the heater and the temperature sensor.

Despite the previous attempts to address the thermal management issues of SAW devices, significant problems remain in the industry. What is needed is a device that provides a stable environment for temperature and vibration sensitive devices. The control structure should work with electronics, namely SAW devices and OCXO devices, and have very high thermal gain and zero gradient. Such as invention should be a cost-effective solution and rugged in order to work in different environments. It would be beneficial to have improved aging as well. Finally, the device should be simplistic in that it is easy to manufacture and develop.

SUMMARY OF THE INVENTION

The present invention is devised in the light of the problems of the prior art described herein. Accordingly, an object of the present invention is a structure that ideally has negligible temperature change even in varying external temperatures. The temperature sensitive components and associated electronics and circuitry are therefore insensitive to changes to ambient or external temperature changes.

Due to the ever-changing electronics industry, the geometry continues to shrink and the complexity increases. While the heat dissipation requirements increase, making it very difficult to control thermal gradients. The present invention encompasses a number of aspects that in combination create a precision SAW device.

A new class of oscillators, termed evacuated miniature SAW oscillators (EMSO), has been designed to meet emerging requirements of signal generation. The ovenized EMSO devices provide functionality similar to the known oven heated crystal resonator and oscillator assemblies, however the SAW devices operate at much higher frequencies. More specifically, SAW devices operate as much as ten times higher frequencies than the standard crystal resonators.

Evacuated bulk wave OCXO technology is extended to the field of SAW oscillators in the present invention with some surprising results. In addition to the advantage of direct operation at the SAW frequency, resulting devices exhibit excellent frequency stability over temperature. Relatively low power and short warm-up times are also obtained.

SAW resonators exhibit many properties desirable as resonant elements in frequency sources for communication systems. Compared to bulk acoustic wave (BAW) based oscillators, the primary drawback to SAW resonator based oscillators has previously been the overall frequency stability. With a temperature stability several times larger than that of AT cut BAW resonators, ST quartz based SAW oscillators often require some method of stabilizing the frequency. AT refers to the cut angle of the quartz and has a typical temperature drift of +/−20 ppm, and is used in conventional BAW devices. ST is generally used for SAW devices and has a typical variation of +/−100 ppm or greater. The larger temperature drift has heretofore limited the range of applications of such devices.

Voltage controlled SAW oscillators (VCSO) employing delay line or multipole SAW resonators have sufficient pulling range to compensate for temperature, but the resulting close-in noise may be insufficient for low noise applications. These limitations can be partially overcome by imbedding the VCSO into a PLL with a lower frequency BAW based oscillator, but overall device size and complexity will increase. Additionally, to facilitate the increased tuning range necessary for the VCSO to track the lower frequency BAW oscillator, device Q must be degraded.

The methodologies used to design and manufacture these devices are a synergy of SAW with evacuated ovenized oscillator technology previously developed for BAW oscillators. Warm-up, power dissipation, and size are greatly improved as compared to conventional ovenized SAW oscillators.

Thus, an object of the invention is a SAW resonator that is a highly stabilized oscillator having improved performance characteristics due to the thermal management. An object of the invention is a temperature controlled structure for a SAW resonator, wherein the SAW device is directly bonded to the thermal controlled substrate. In a preferred embodiment the SAW device is directly bonded to a temperature controlled ceramic substrate. A further object of the invention includes a ceramic substrate affixed to the package floor with wire jumpers electrically connecting the heated substrate to the package floor and from the package floor to the pins.

The package encompasses the oscillator circuitry, temperature sensors, and heaters. By monitoring the temperature via the temperature sensors and controlling the temperature of the package above ambient, it is possible to control the temperature of the substrate within a fraction of a degree.

One objective of the invention is to produce a SAW based oscillator having the inherent spectral advantages of high frequency operation without multiplication, but with significantly improved frequency stability. It was also desirable to utilize the inherently higher Q of a resonator, rather than a delay line. By controlling the temperature of the SAW, the goal is to exploit the inherently higher Q of a resonator.

Evacuation of the package drastically lowers the heat loss because there is no air in the package. The power consumption is cut by approximately one third. The evacuation also aids in reducing or eliminating the possibility of contamination of the SAW package, which also improves the aging characteristics for long term stability.

One point of novelty lies in the combination of heat insulated structure supporting the high thermal conductive substrate on which the SAW resonator is directly device mounted and further comprising temperature controller and evacuation of the package.

The present invention exploits the thermal properties of a high vacuum environment with novel design techniques, such that thermal conductivities between the heated region and the external package can exceed 400° C./W.

An additional benefit is that the SAW device is operating in a high vacuum, very clean environment. This is generally associated with enhanced device Q and aging properties. The EMSO uses hybrid chip and wire construction in a manner similar to the EMXO.

An object of the invention is a temperature controlled structure for an oscillator device, comprising a package enclosure having a top, a floor, and side walls, and wherein one or more pins extend from the package. The package enclosure has a thermal conductive substrate, a resonator mounted to the thermal conductive substrate, and with two or more insulating structures securing the thermal conductive substrate above the second substrate. A second substrate is secured to the package floor, and having one or more interconnects electrically connecting the thermal conductive substrate with the second substrate and with the one or more pins.

Another object includes the temperature controlled structure, wherein the resonator is a surface acoustical wave device and directly bonded to the thermal conductive substrate. The resonator can also be a bulk acoustical wave device and secured by a plurality of clips extending from the thermal conductive substrate. One material for the thermal conductive substrate and the second substrate is ceramic, and in one embodiment the insulating structures are four ceramic posts.

And a further object includes the temperature controlled structure, further comprising a heater device, temperature sensor and temperature control circuitry. There can be one or more additional substrate layers. For additional thermal improvements, the package is vacuum evacuated.

An additional object is the temperature controlled structure, further comprising a temperature hood covering one or more of the temperature sensitive components on the thermal conductive substrate.

An object of the invention is a temperature controlled package for an oscillator, comprising a device enclosure having a top, a floor, and side walls, and wherein one or more pins extend from the package and the package is evacuated. There is a thermal conductive substrate, with a surface acoustical wave device directly bonded to the thermal conductive substrate where two or more insulating posts are used for securing the thermal conductive substrate. A temperature controller is used for maintaining an internal temperature above an ambient temperature, wherein the controller uses one or more temperature sensors and one ore more heaters to maintain the internal temperature. There are one or more interconnects electrically connecting the thermal conductive substrate to one or more pins.

Yet a further object is the temperature controlled package for an oscillator, further comprising a second substrate layer affixed to the floor for housing temperature insensitive components, wherein interconnects electrically connect the thermal conductive substrate layer and the second substrate layer. Additionally, there can be one or more additional substrate layers, wherein temperature insensitive components are mounted to the one or more substrate layers.

An object includes the temperature controlled package for an oscillator, further comprising a temperature hood covering one or more of the temperature sensitive components on the thermal conductive substrate.

An object of the invention is a resonator package with thermal control, comprising a device enclosure having a top, a floor, and side walls, and wherein one or more pins extend from the device enclosure. There is a thermal conductive substrate having a plurality of temperature sensitive components mounted to the thermal conductive substrate, and a plurality of insulating posts securing the thermal conductive substrate. Also, a second substrate is affixed to the floor of the device enclosure, with a plurality of temperature insensitive components mounted to the second substrate. One or more second substrate interconnects are electrically connecting the second substrate with one or more pins extending from the device enclosure. And, one or more thermal conductive substrate interconnects are electrically connecting the thermal conductive substrate to one or more pins extending from the package enclosure. Furthermore, the device enclosure has a section of printed circuit board, wherein the pins are electrically connected and physically mated with the printed circuit board. An object includes having one or more interconnects electrically connecting the thermal conductive substrate with the second substrate.

Another object is the resonator package with thermal control, wherein the resonator package is a surface mount device. And, where one of the temperature sensitive components is a surface acoustical wave device directly bonded to the thermal conductive substrate. Alternatively, one of the temperature sensitive components can be a bulk acoustical wave device secured by a plurality of clips to the thermal conductive substrate.

An additional object is the resonator package with thermal control, further comprising a temperature hood covering one or more of the temperature sensitive components on the thermal conductive substrate.

Still other objects and advantages of the present invention will become readily apparent to those skilled in this art from the following detailed description, wherein we have shown and described only a preferred embodiment of the invention, simply by way of illustration of the best mode contemplated by us on carrying out our invention. As will be realized, the invention is capable of other and different embodiments, and its several details are capable of modifications in various obvious respects, all without departing from the invention.

BRIEF DESCRIPTION OF THE DRAWINGS

The present invention will be readily understood by the following detailed description in conjunction with the accompanying drawings, wherein like reference numerals designate like structural elements.

DESCRIPTION OF THE PREFERRED EMBODIMENT

The present invention is an improvement to thermal packaging for crystal resonator assemblies. The inventive subject matter describes a SAW and BAW oscillator configurations and multiple component layering.

Figure 1:
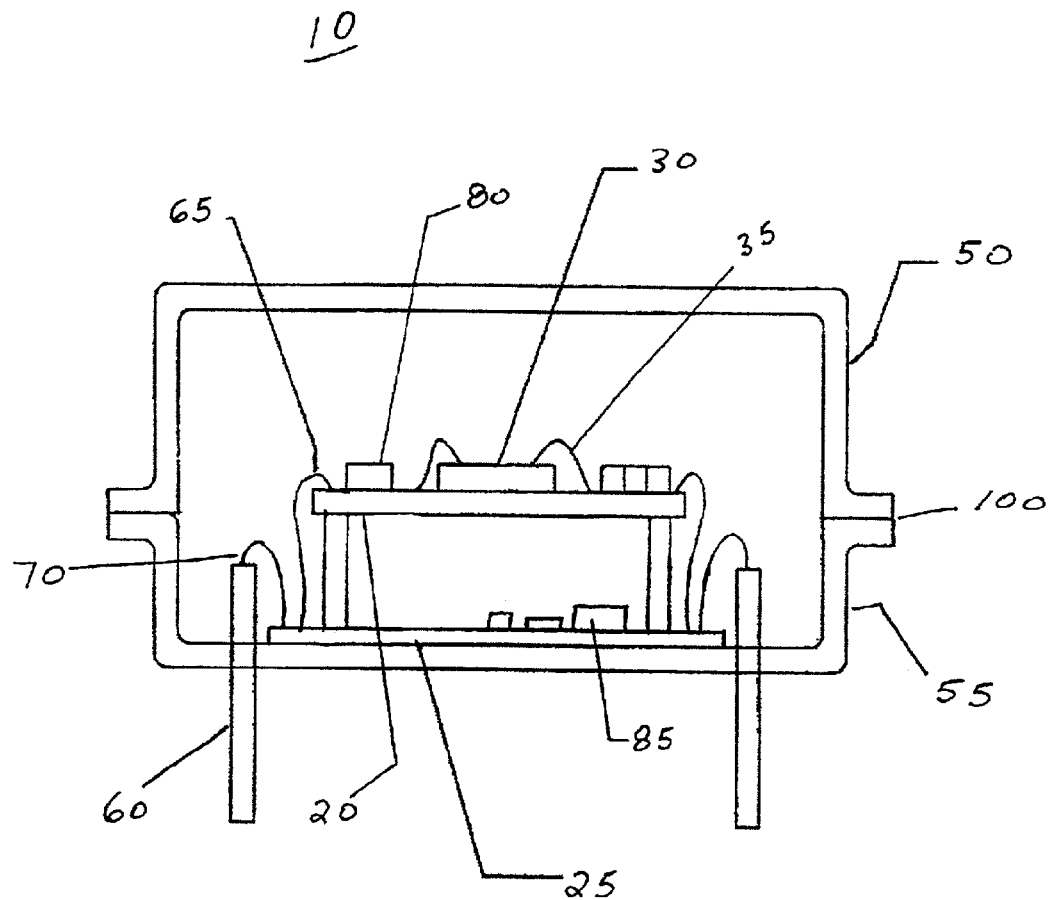
FIG. 1 side perspective view of oscillator package showing the multi-level substrates and component interconnections.

Referring to FIG. 1, a thermal resonator package 10 shows a high thermal conductivity substrate 20, upon which a resonator 30 is mounted. In this particular embodiment, a SAW resonator is shown with the device directly bonded to the thermally conductivity substrate 20. One method of bonding the SAW device 30 is utilizing epoxy and having wire jumpers 35 electrically connect the SAW device to the ceramic substrate 20. A BAW device can also be packaged using clips as is known in the arts that retain the BAW device, which is described in U.S. Pat. No. 5,917,272.

One of the features of the EMSO is the integration of a bare SAW device into the microelectronic circuitry of a hybrid package. A cold welded package is used to house the entire module. The high vacuum obtainable with cold-weld sealing techniques ensures high Q, low power consumption and good temperature performance. Additionally, bonding the resonator 30 directly to the heated substrate 20 minimizes temperature gradients across the resonator 30 as opposed to BAW devices that are suspended from the substrate with metal clips.

The package 10 in this embodiment is a single dual inline package (SDIL) that is cold-welded at the interface 100 between the upper section 50 and the lower section 55. External pins 60 extend from the lower section 55 of the package and are electrically connected to both substrates 20, 25 by jumpers 65, 70. The entire package 10 is evacuated, removing all air from the package 10. This environment provides less susceptibility to contamination as well as improved thermal characteristics that are known in the art for other resonator devices. The EMSO device is smaller and also less susceptible to vibration problems.

This particular embodiment is intended to have two levels of construction. The elevated high thermal conductivity substrate 20 is used for components that generate heat, such as oscillators, and temperature sensitive components 80. The thermally conductive substrate 20 acts as a heat sink for distributing heat and is mounted to two or more insulating structures 40 that provide rigidity and support for the resonator 30. Wire jumpers 75 and etched pads (not shown) and other printed circuit interconnection techniques are used to electrically connect the components 80, 90, 30 on the elevated substrate 20. The upper level substrate 20 is secured in place by elevated standoffs 40, such as glass. While it is within the scope of the invention to have one or two posts, in a preferred embodiment four insulating structures are used at each of the corners of the thermally conductive substrate 20 for SAW devices and three insulating posts for BAW devices. The number of posts depends upon the specific requirements, particularly with respect to vibration issues.

The lower substrate 25 houses those components that are less temperature sensitive and provide additional space for components that can increase the functionality of the package 10. This substrate 25 does not therefore require the thermal demands of the upper substrate 20. The lower substrate 25 is typically ceramic and can be directly mounted to the package 10 floor by adhesive or epoxy. It can also be mounted to smaller stand-offs (not shown), and it can even be horizontally held in place between the pins 60. This lower substrate 25 typically extends beyond the footprint of the upper thermal substrate 20 and allows the jumper wires 65 to land cleanly on the lower substrate.

The wire jumpers 65 electrically connect the upper structure 20 and the lower structure 25. n lieu of wire jumpers, flex circuits and other electrical interconnects are within the scope of the invention to electrically connect any of the layers and pins. Conductive posts or portions of the posts can also be used to route electrical signals between the substrate layers and should be considered interconnects as described in the present application. Wire jumpers and etched pads (not shown) and other printed circuit interconnection techniques are used to electrically connect the components 85, 95 on the lower substrate 25. The lower level components 85, 95 are the controller electronics and processing circuitry to enable enhanced functionality of the device.

While showing two distinct levels, it is within the scope of the invention to have a plurality of elevated substrates for housing additional components using the same techniques described herein. While the elevation height of the package 50 may increase with multiple layers, the additional circuitry can enable increased functionality. The additional layers can be sandwiched between the lower substrate 25 and the upper substrate 20 and secured by individual posts, integrated with the existing posts 40 or pins 60, or retained by clips extending from either the thermal substrate 20 or the lower substrate 25. Such clips are well known and typically employ two, three or four clips for structural support.

A heater 80, such as a power transistor heats the thermally conductive substrate 20 and disperses the heat across the substrate 20 by conduction. The temperature is regulated by a conventional op-amp based controller that is located on the lower level 25. Oscillator circuitry is connected to the heated substrate 20, along with the SAW resonator 30.

Figure 2:
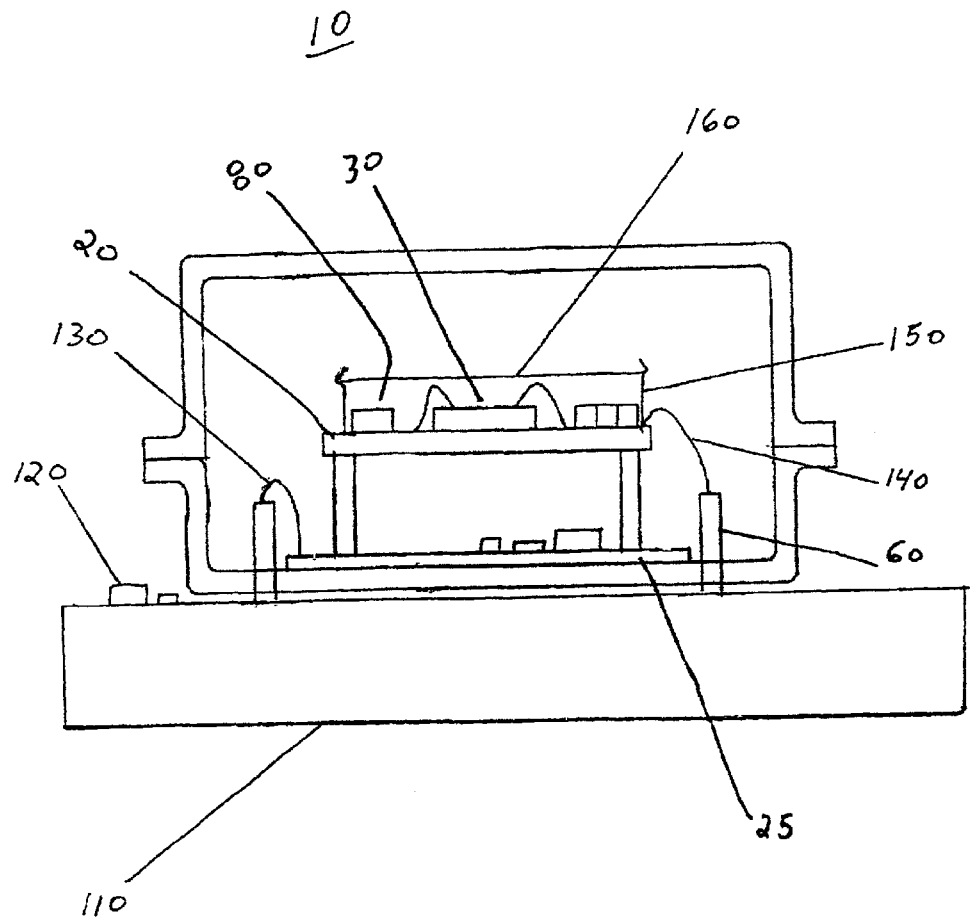
FIG. 2 side perspective view of oscillator package showing the multi-level substrates, temperature hood and component interconnections for printed circuit board.

FIG. 2 illustrates variations of the present invention, and depicts the package 10 mounted onto a printed circuit board 110. The section of printed circuit board 110 can accommodate control circuitry and other components 120. The electrical interface between the package 10 and the printed circuit board is through one or more pins 60. As shown, several electrical connections can be used. For example, the temperature sensitive components 80 and resonator 30 can be electrically connected to one or more pins 60 and the printed circuit board 110. The lower substrate 25 can electrically connect to the printed circuit board through one or more pins 60. Other wiring combinations are within the scope of the invention. The entire package 10 can have solder pads (not shown) or other interconnect and exist as an independent mountable device such as a surface mount device.

Also shown in FIG. 2, is a further temperature controlling feature, namely a thermal hood 160. In this embodiment there are a plurality, typically two, three or four, of mounting clips 150 that retain the metal hood 160. The metal hood 160 covers the temperature sensitive components 80, 30 and increases the temperature control performance.

Figure 3:
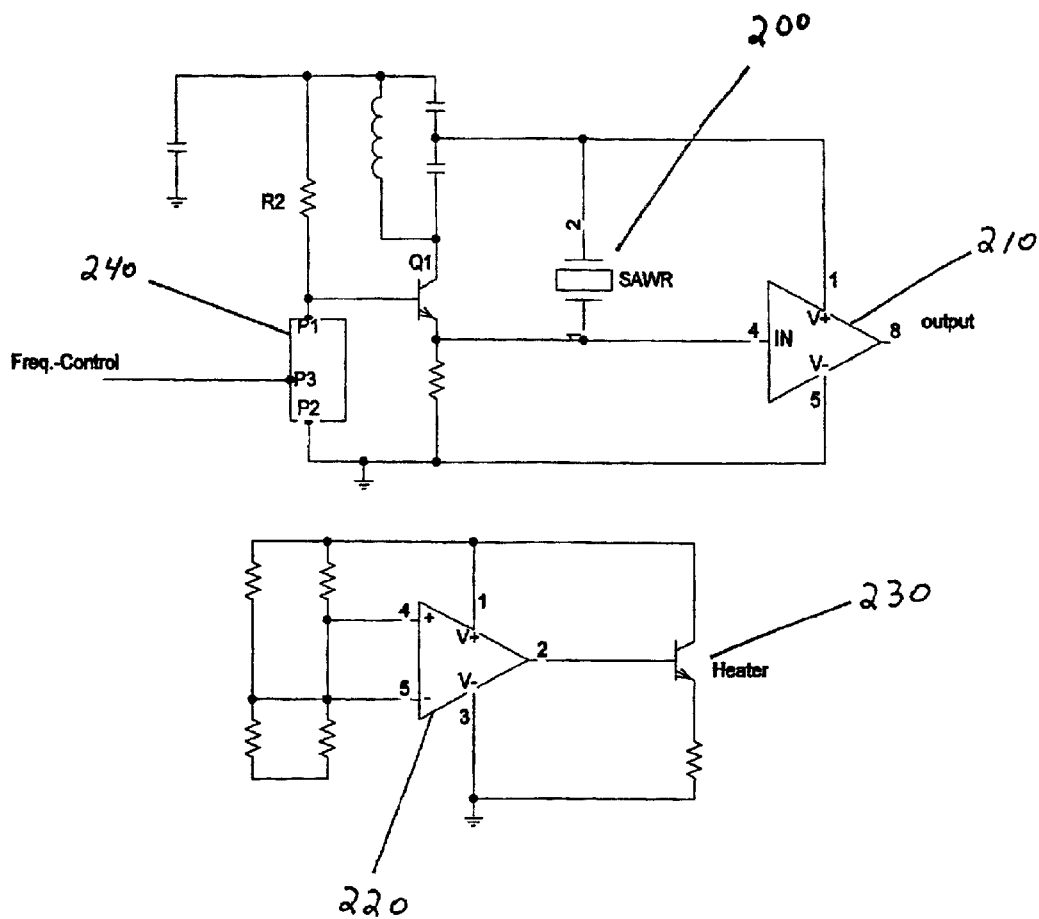
FIG. 3 schematic representation of the oscillator electronics and the control circuitry.

FIG. 3 shows the circuit elements of the oscillator in the EMSO. One of the considerations during the electrical design of the EMSO was the minimization of internal power dissipation. The high thermal resistance of the vacuum package induces a 0.5-degree Celsius rise in temperature for every milliwatt of power dissipated.

The oscillator circuit is a modified low power variation of a grounded base oscillator described in the prior art and well known to those skilled in the art. Temperature rise is held under 7.0 deg. The low power dissipation results in a wider ambient temperature range. Similarly, the output stage is designed for low VSWR and minimal signal compression, resulting in low power dissipation, sufficient output level, and good noise floor. In one embodiment the oven controller circuit is a PI controller 240 set for slightly damped behavior. The heater 230 and corresponding control circuit, which includes differential amplifier 220, maintains the elevated temperature of the device.

A traditional SAW resonator 200 on quartz substrate is used as the oscillator. The supporting components and output amplifier 210 are designed to provide a stable output signal. By properly choosing substrate orientation and geometric structures of the inter-digital transducer (IDT) and the reflective gratings, its turnover temperature is made to be coincident with the designed oven temperature of approximately 85° C. To suppress high order spurious modes, the IDT is apodised such that the generated acoustic beam can better match the profile of fundamental resonant mode. The unloaded Q value is about 10,000.

Figure 4:
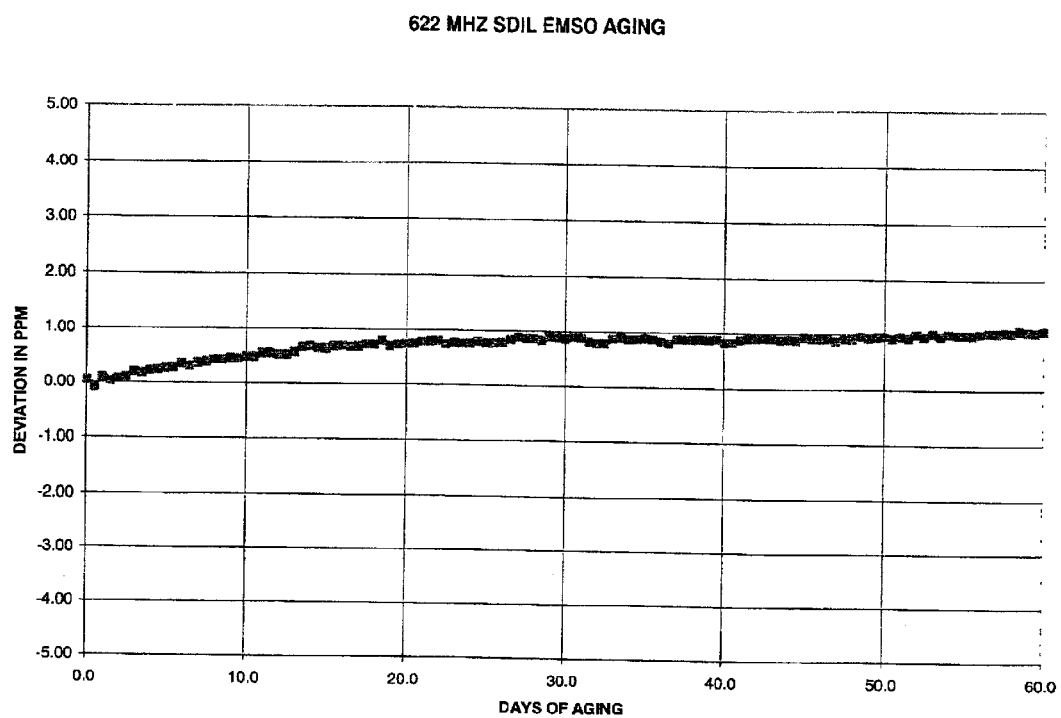
FIG. 4 graphical presentation of aging performance for the device showing the deviation over an extended number of days.

FIG. 4 shows aging results performed on an SDIL EMSO device operating at 622 MHz. The graph plots the days of aging on one axis (X) and the deviation (ppm) on the other axis (Y). As shown the device has extremely low deviation over a 60 day period.

Figure 5:
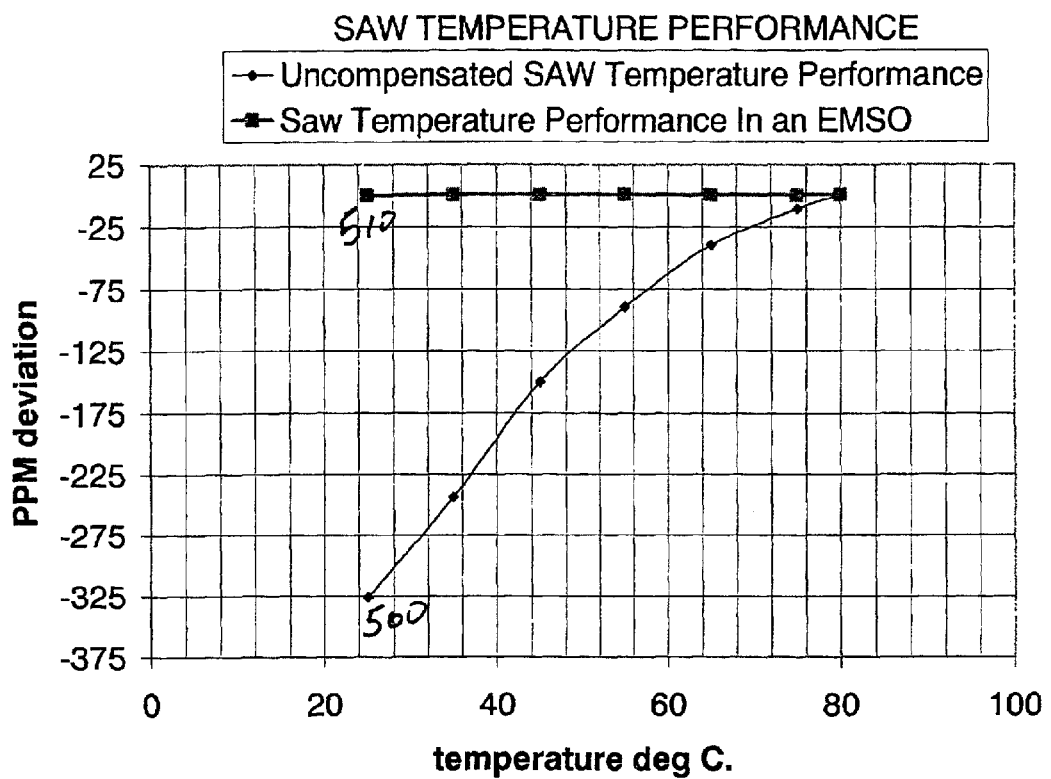
FIG. 5 graphical representation of compensated SAW performance versus uncompensated performance.

Referring to FIG. 5, temperature performance is measured for EMSO, and graphically represented with temperature on the X axis and PPM deviation on the Y axis. The graph demonstrates the ovenized and non-ovenized results 510, 500 respectively. The uncompensated response 500 shows a much greater error rate over the same temperature range as opposed to the EMSO package compensated results 510. SAW based frequency stability in the ovenized packaging of the present invention has a performance of +/−1.0 ppm, which represents a significant improvement over the non-ovenized response.

Figure 6:
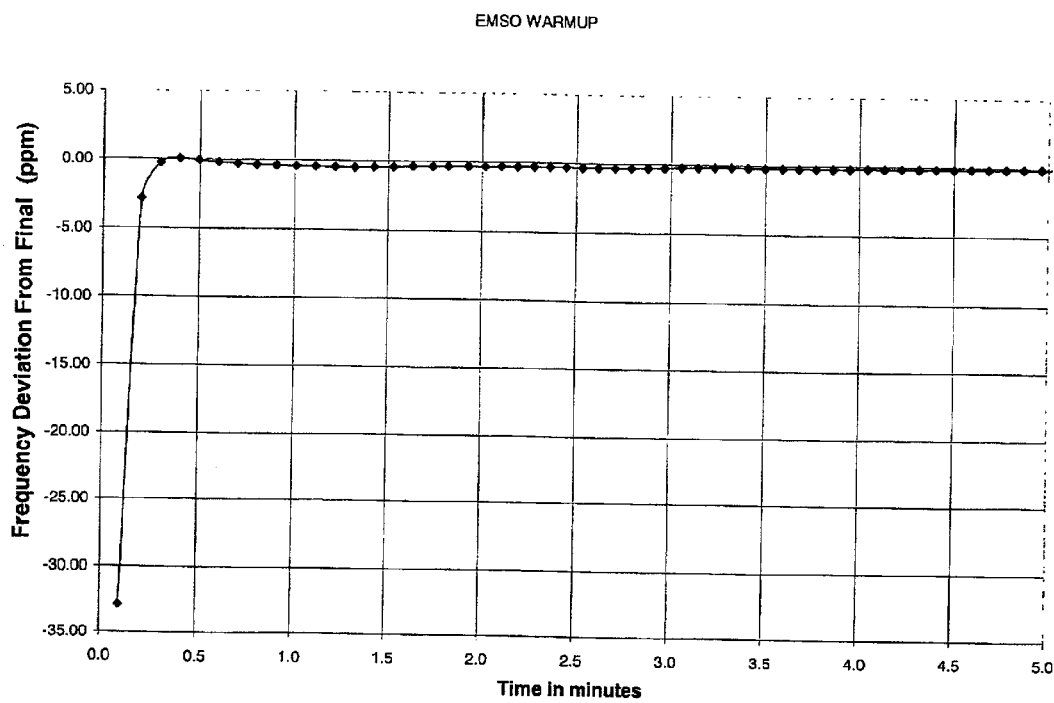
FIG. 6 graphical presentation of EMSO warm-up performance in a room ambient environment.

EMSO warm-up performance is shown in FIG. 6, that shows the response in time versus frequency deviation (ppm). Internal resonator temperature begins to stabilize along with frequency after approximately 10 seconds, and within 5 minutes, the output frequency is well within 1 ppm of final frequency.

Figure 7:
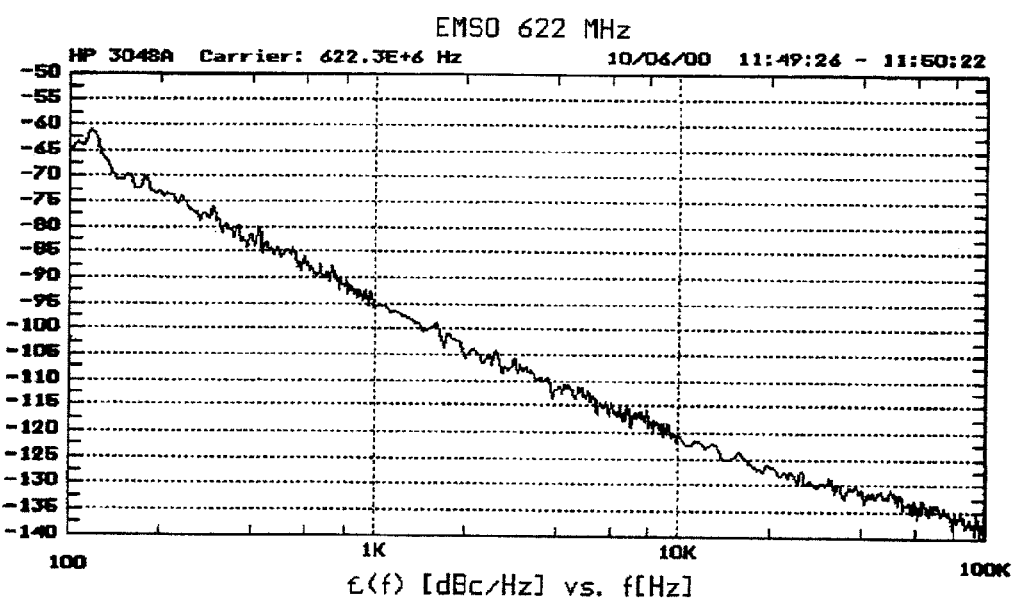
FIG. 7 graphical measurements of EMSO phase noise from 10 kHz to 10 MHz with a carrier of 622 MHz.
Figure 1:
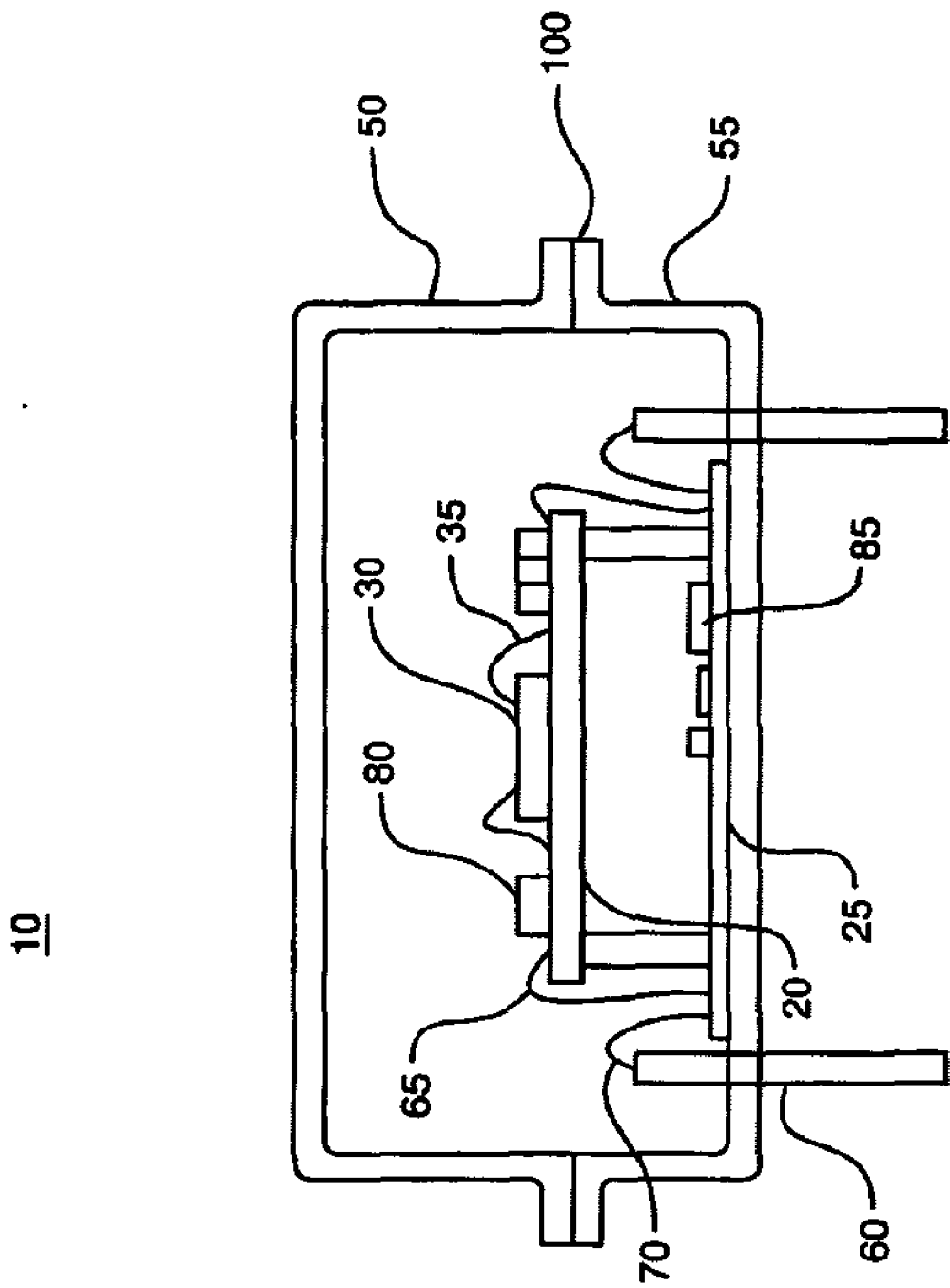
Figure 3:
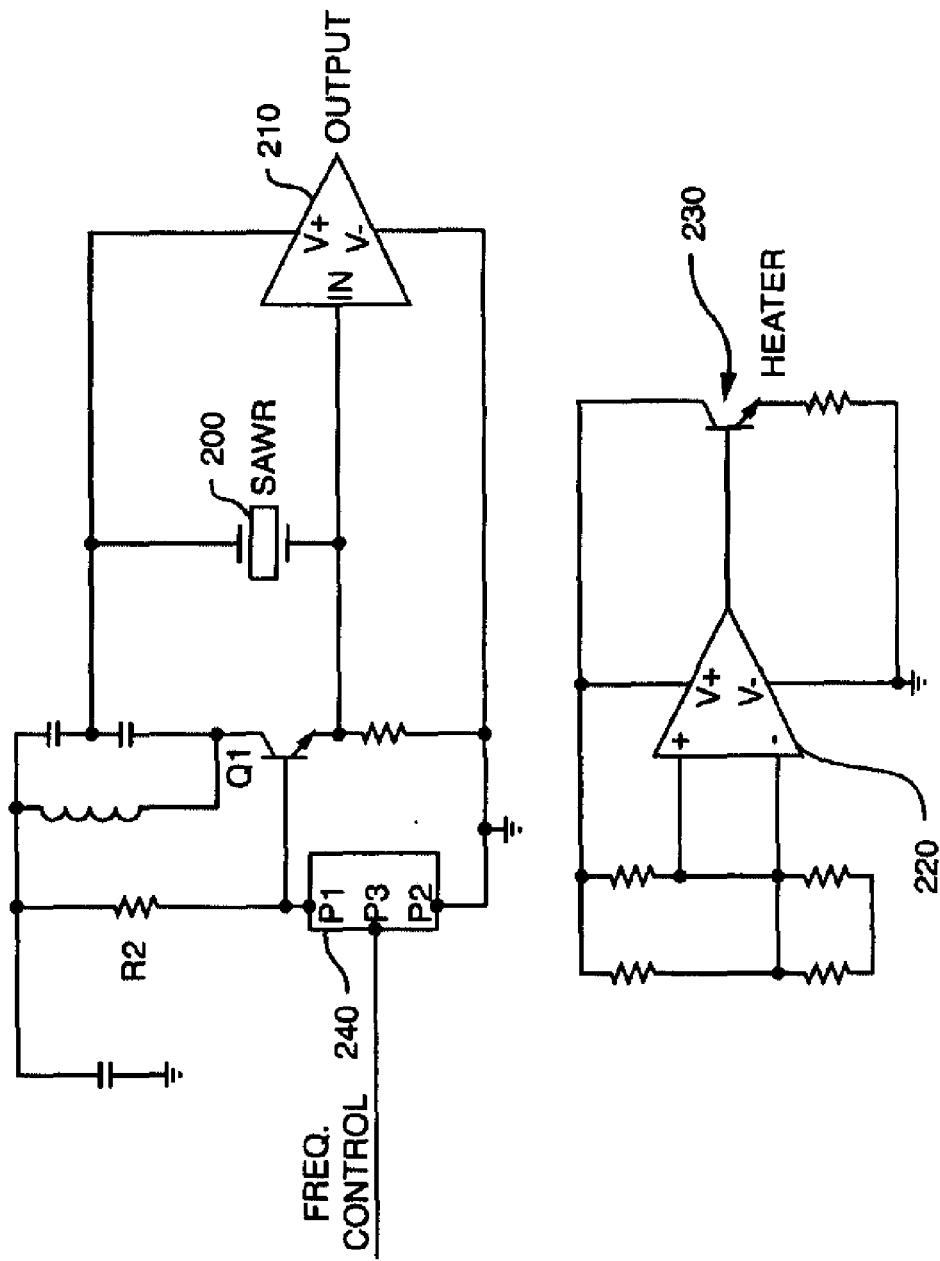
Figure 4:
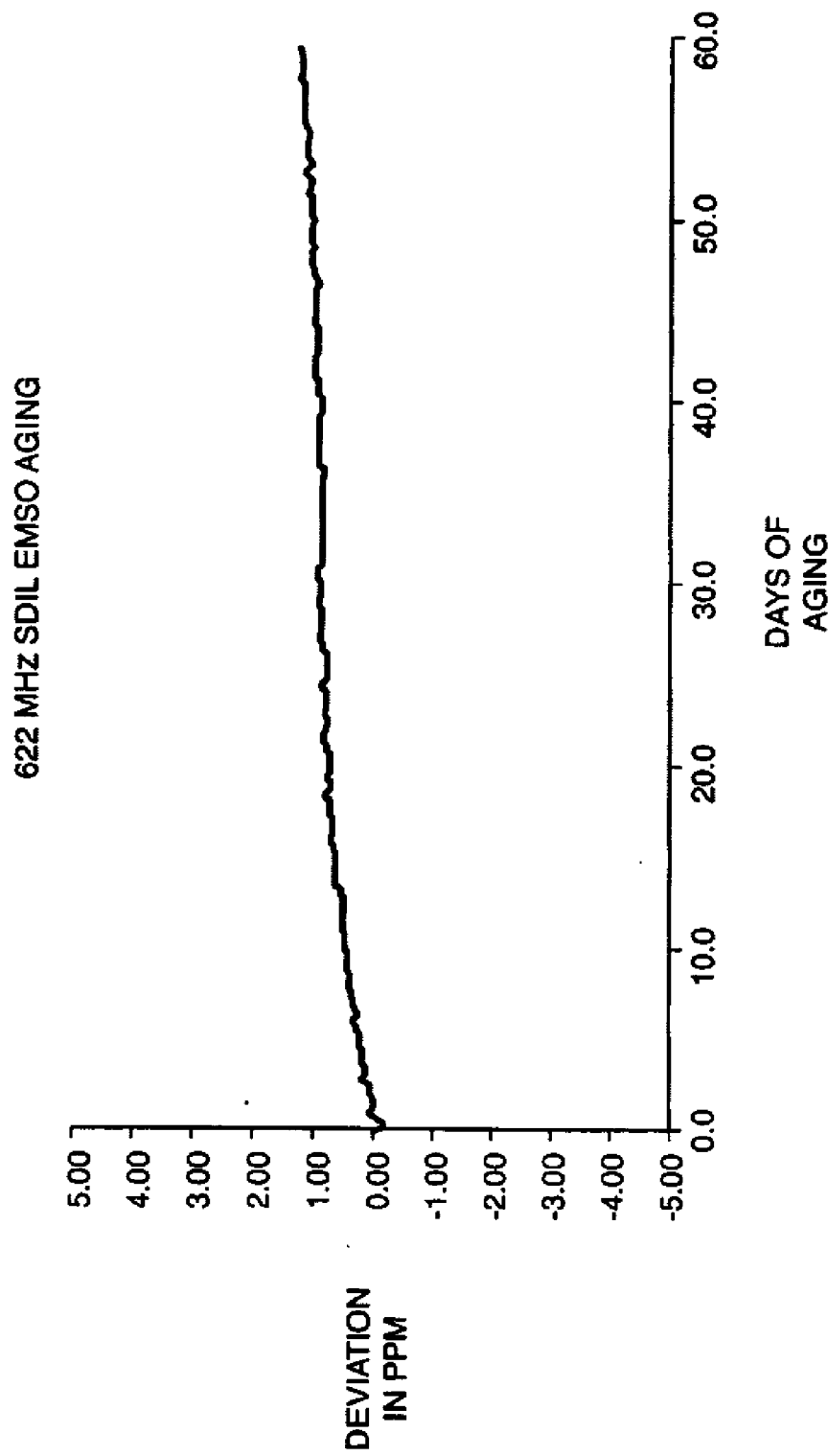
Figure 5:
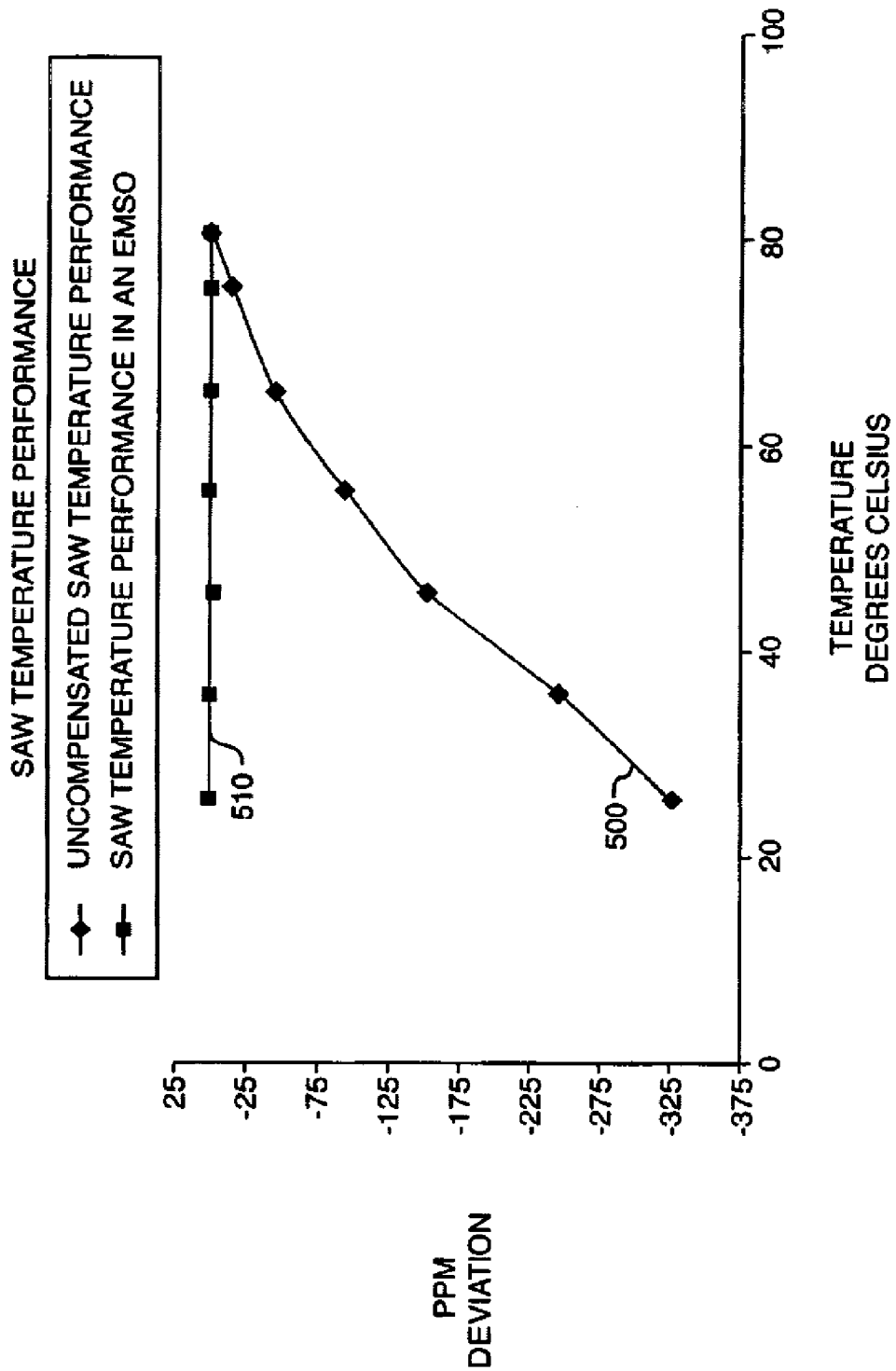
Figure 6:
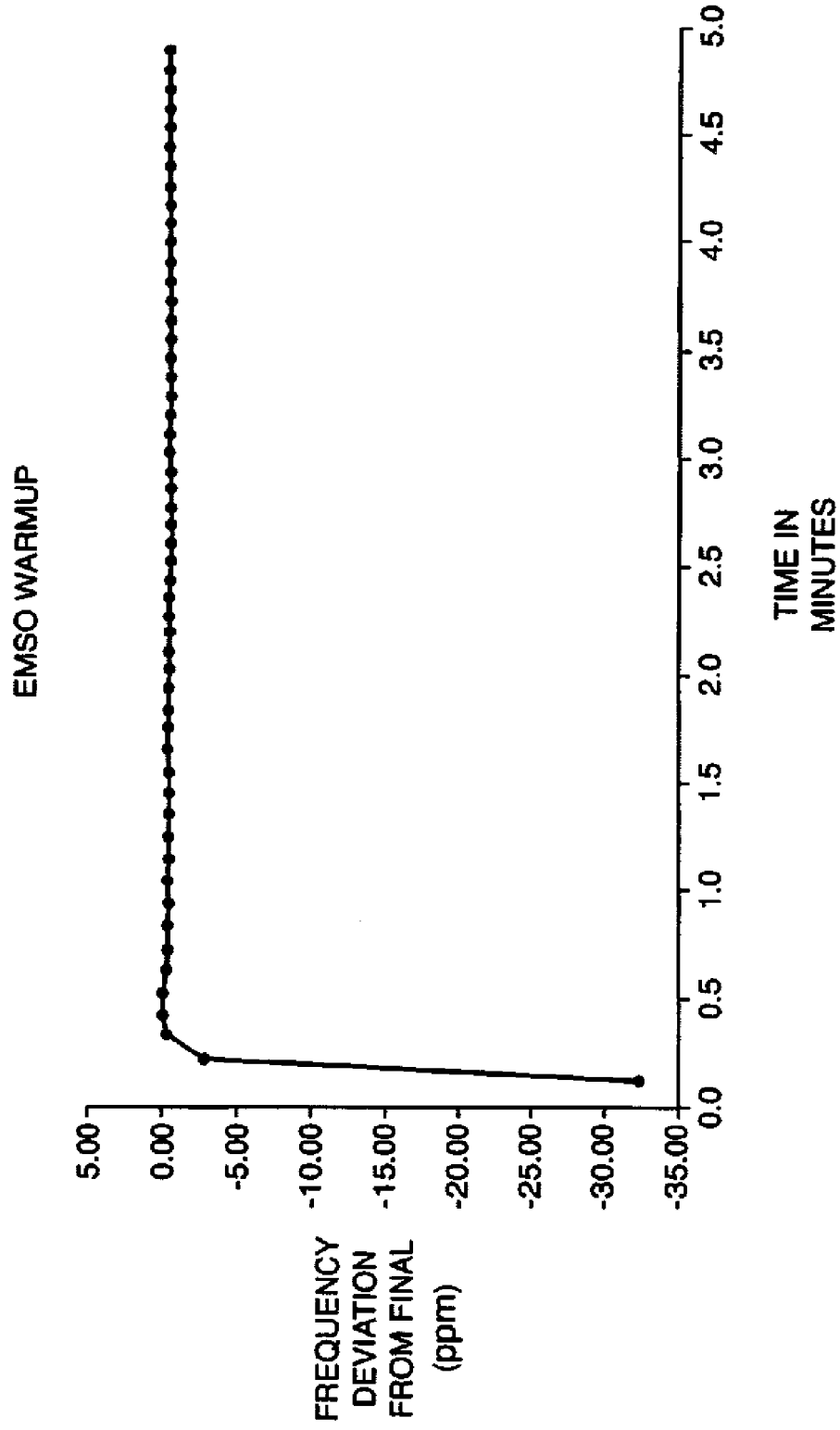
Figure 7:
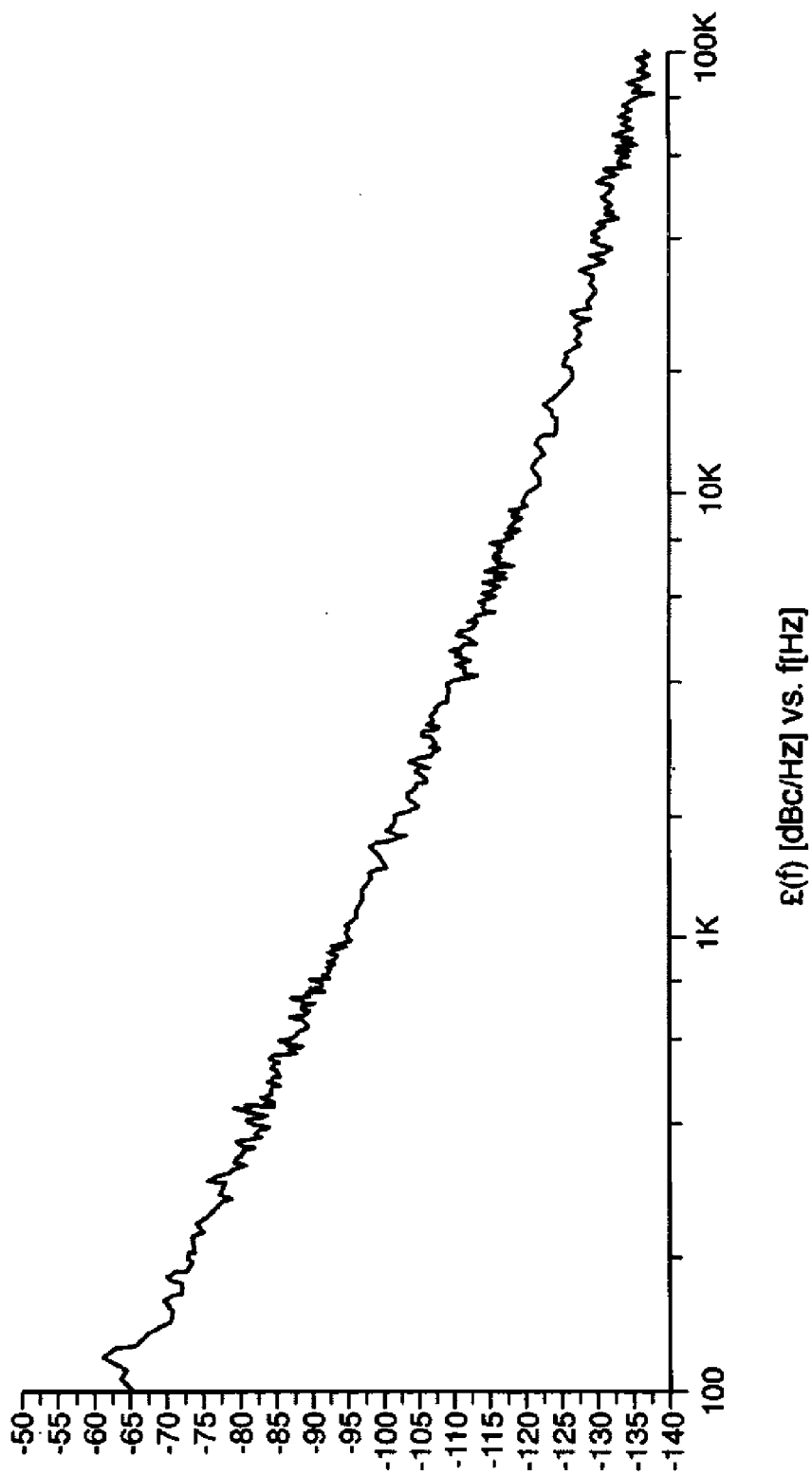

FIG. 7 is a representative plot of EMSO phase noise. Integrated phase noise from 10 Khz to 10 MHz is calculated to be less than 0.3 pico-seconds rms. Close in phase noise levels and slopes are largely dependent on resonator characteristics, leaving additional opportunities for improved phase noise performance.

Numerous characteristics and advantages have been set forth in the foregoing description, together with details of structures and design, and the novel features thereof are pointed out in appended claims. The disclosure, however, is illustrative only, and changes may be made in arrangement and details, within the principle of the invention, to the full extent indicated by the broad general meaning of the terms in which the appended claims are expressed.

The objects and advantages of the invention may be further realized and attained by means of the instrumentalities and combinations particularly pointed out in the appended claims. Accordingly, the drawing and description are to be regarded as illustrative in nature, and not as restrictive.

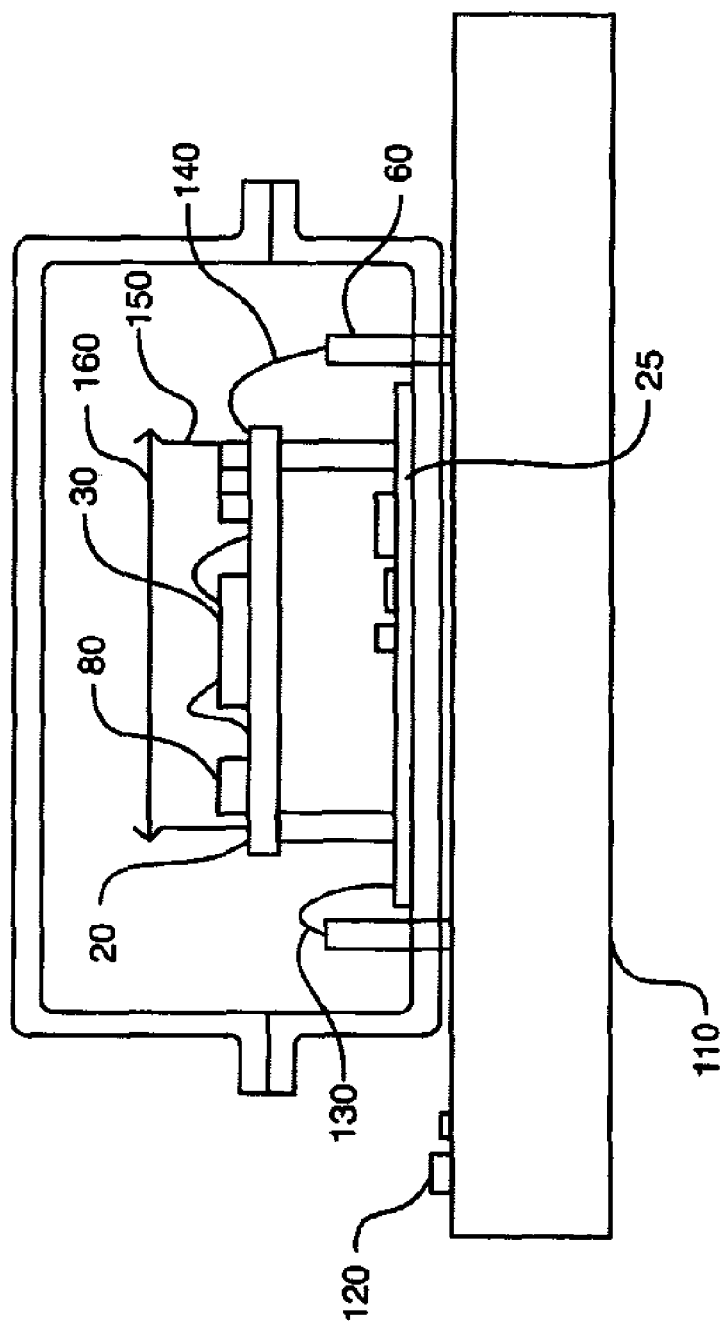

What is claimed is:

1. A temperature controlled structure for an oscillator device, comprising:
   a package enclosure having a top, a floor, and side walls, and wherein at least one pin extends from said package enclosure;
   a thermal conductive substrate housed within said package enclosure;
   a resonator mounted to said thermal conductive substrate;
   at least one insulating structure securing said thermal conductive substrate;
   a second substrate affixed to said floor, said second substrate having at least one component; and
   at least one interconnect electrically connecting said thermal conductive substrate with said second substrate and with said at least one pin.

2. The temperature controlled structure according to claim 1, wherein said resonator is a surface acoustical wave device and directly bonded to said thermal conductive substrate.

3. The temperature controlled structure according to claim 1, wherein said resonator is a bulk acoustical wave device and secured by a plurality of clips extending from said thermal conductive substrate.

4. The temperature controlled structure according to claim 1, further comprising a heater device, temperature sensor and temperature control circuitry.

5. The temperature controlled structure according to claim 1, further comprising at least one additional substrate disposed between said second substrate and said thermal conductive substrate.

6. The temperature controlled structure according to claim 1, wherein said package is vacuum evacuated.

7. The temperature controlled structure according to claim 1, wherein said thermal conductive substrate and said second substrate are ceramic.

8. The temperature controlled structure according to claim 1, wherein said at least one insulating structure is a glass posts.

9. The temperature controlled structure according to claim 1, further comprising a temperature hood covering said thermal conductive substrate.

10. A temperature controlled package for an oscillator, comprising:
    a device enclosure having a top, a floor, and side walls, and wherein at least one pin extends from said package, wherein said device enclosure is evacuated;
    a thermal conductive substrate housed within said device enclosure;
    a surface acoustical wave device directly bonded to said thermal conductive substrate;
    at least one insulating post securing said thermal conductive substrate;
    a second substrate level secured to said floor by at least one insulating structure wherein said second substrate level houses at least one component;
    a temperature controller for maintaining an internal temperature above an ambient temperature, wherein said controller uses at least one temperature sensor and at least one heater to maintain said internal temperature; and
    at least one interconnect electrically connecting said thermal conductive substrate to said at least one pin and said second substrate level.

11. The temperature controlled package for an oscillator according to claim 10, further comprising at least one additional substrate level disposed between said second substrate level and said thermal conductive substrate.

12. The temperature controlled package for an oscillator according to claim 11, wherein said at least one component is mounted to said at least one additional substrate level.

13. The temperature controlled package for an oscillator according to claim 10, further comprising a temperature hood covering said thermal conductive substrate.

14. A resonator package with thermal control, comprising:
    device enclosure having a top, a floor, and side walls, and wherein at least one pin extends from said device enclosure;
    a thermal conductive substrate having a plurality of temperature sensitive components mounted to said thermal conductive substrate;

a plurality of insulating posts securing said thermal conductive substrate;
   a second substrate affixed to an interior surface of said floor of said device enclosure, with a plurality of temperature insensitive components mounted to said second substrate;
   at least one second substrate interconnect electrically connecting said second substrate with said at least one pin extending from said device enclosure;
   at least one thermal conductive substrate interconnect electrically connecting said thermal conductive substrate to said at least one pin extending from said device enclosure; and
   a section of printed circuit board, wherein said at least one pin is electrically connected with said printed circuit board and wherein said device enclosure is physically mated with said printed circuit board.

15. The resonator package with thermal control according to claim 14, wherein said resonator package is a surface mount device.

16. The resonator package with the thermal control according to claim 14, further comprising at least one interconnect electrically connecting said thermal conductive substrate with said second substrate.

17. The resonator package with thermal control according to claim 14, further comprising a temperature hood covering said plurality of temperature sensitive components on said thermal conductive substrate.

18. The resonator packager with thermal control according to claim 14, wherein one of said plurality of temperature sensitive components is a surface acoustical wave device directly bonded to said thermal conductive substrate.

19. The resonator package with thermal control according to claim 14, wherein one of said plurality of temperature sensitive components is a bulk acoustical wave device secured by a plurality of clips to said thermal conductive substrate.

20. The temperature controlled structure according to claim 9, further comprising at least one temperature sensitive component on said thermal conductive substrate and covered by said temperature hood.

21. The temperature controlled structure according to claim 1, wherein said at least one component is chosen from the group of components consisting of: PI controller, heater, differential amplifier, and output amplifier.

* * * * *

UNITED STATES PATENT AND TRADEMARK OFFICE
CERTIFICATE OF CORRECTION

PATENT NO.    : 6,731,180 B1
DATED         : May 4, 2004
INVENTOR(S)   : Roger L. Clark, Joseph V. Adler and Jacob M. Li It is certified that error appears in the above-identified patent and that said Letters Patent is hereby corrected as shown below:

Replace title page with the following title page
Delete informal drawings, Figs. 1-7, insert the following formal drawings Figs. 1-7

Signed and Sealed this

Ninth Day of November, 2004

JON W. DUDAS
*Director of the United States Patent and Trademark Office*

United States Patent
Clark et al.

(10) Patent No.: US 6,731,180 B1
(45) Date of Patent: *May 4, 2004

(54) EVACUATED HYBRID OVENIZED OSCILLATOR

(75) Inventors: Roger L. Clark, Windham, NH (US); Joseph V. Adler, New Milford, CT (US); Jacob M. Li, Danbury, CT (US)

(73) Assignee: Deleware Capital Formation Inc., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/056,958

(22) Filed: Oct. 22, 2001

Related U.S. Application Data
(60) Provisional application No. 60/242,103, filed on Oct. 20, 2000.

(51) Int. Cl.[7] .................. H03B 5/32; H03L 7/00
(52) U.S. Cl. ............... 331/176; 331/68; 331/69; 331/158; 310/341; 310/343; 310/344
(58) Field of Search ........................ 310/343, 346, 310/340, 341, 342, 344; 331/68, 69, 158, 176

(56) References Cited

U.S. PATENT DOCUMENTS

| | | |
|---|---|---|
| 4,213,104 A | 7/1980 | Cullen et al. |
| 4,317,985 A | 3/1982 | Wilson |
| 4,427,515 A | 1/1984 | Yuhara et al. |
| 5,059,848 A | 10/1991 | Mariani |
| 5,594,979 A | 1/1997 | Borchelt et al. |
| 5,771,556 A | 6/1998 | Allen et al. |
| 5,917,272 A | 6/1999 | Clark et al. |
| 5,919,383 A | 7/1999 | Beguin et al. |
| 6,114,635 A | 9/2000 | Lakin et al. |
| 6,131,256 A | 10/2000 | Dydyk et al. |
| 6,147,565 A * | 11/2000 | Satoh et al. ............ 331/70 |
| 6,187,611 B1 | 2/2001 | Preston et al. |
| 6,236,145 B1 * | 5/2001 | Biernacki ............ 310/346 |

OTHER PUBLICATIONS

Jackson, Harold W., Tactical Miniature Crystal Oscillator, Proc. 34th Annual Frequency Control Symposium, USAERADCOM, May 1980, pp. 449–456, Ft. Monmouth, NJ USA.

Clark, Roger L., Design Considerations of Vacuum–Sealed OCXO's for high Realiability Applications, IEEE International Frequency Control Symposium, pp. 481–483, Jun. 1996.

Clark, Roger L, Adler, Li J., Improved Aging Results Using Thick–Film Hybrid Packaging and Evacuated Miniature Ovenized Oscillators Using Such Packaging, Joint Meeting EFTF—IEEE IFCS, pp. 420–424, Apr. 1999.

* cited by examiner

*Primary Examiner*—Arnold M. Kinkead
(74) *Attorney, Agent, or Firm*—Maine & Asmus

(57) ABSTRACT

The present invention is for a thermally controlled package for oscillators, particularly evacuated miniature surface acoustical wave oscillators (EMSO) devices. In a preferred embodiment the surface acoustical wave device is bonded directly to a heated substrate. The package is evacuated to improve temperature characteristics. A temperature heater, sensor, and control controller are utilized to maintain the internal package temperature above ambient. In one embodiment there is an additional substrate layer that house components that are not sensitive to temperature with interconnects electrically connecting the heated substrate and the additional substrates.

21 Claims, 7 Drawing Sheets

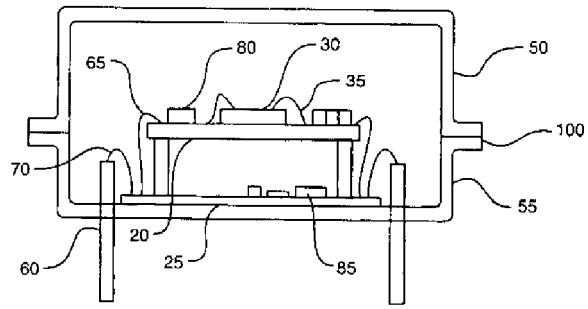

FIG. 1